(12) United States Patent
Shimizu

(10) Patent No.: US 8,677,925 B2
(45) Date of Patent: Mar. 25, 2014

(54) CHAMBER AND FILM FORMING APPARATUS

(75) Inventor: Tsuyoshi Shimizu, Kanagawa (JP)

(73) Assignee: Ulvac, Inc., Kanagawa (JP)

( * ) Notice: Subject to any disclaimer, the term of this patent is extended or adjusted under 35 U.S.C. 154(b) by 779 days.

(21) Appl. No.: 12/744,676

(22) PCT Filed: Dec. 12, 2008

(86) PCT No.: PCT/JP2008/072625
§ 371 (c)(1),
(2), (4) Date: May 25, 2010

(87) PCT Pub. No.: WO2009/078351
PCT Pub. Date: Jun. 25, 2009

(65) Prior Publication Data
US 2010/0251960 A1  Oct. 7, 2010

(30) Foreign Application Priority Data
Dec. 14, 2007  (JP) .................................. 2007-323783

(51) Int. Cl.
  B05C 15/00  (2006.01)
(52) U.S. Cl.
  USPC ........................................................ 118/50
(58) Field of Classification Search
  USPC .............. 118/50, 64, 715–728, 500; 427/294; 204/298.15
  See application file for complete search history.

(56) References Cited

U.S. PATENT DOCUMENTS

| 4,498,378 A | * | 2/1985 | Norrie et al. ..................... 99/472 |
| 4,558,388 A | * | 12/1985 | Graves, Jr. ..................... 360/135 |
| 5,100,527 A | * | 3/1992 | Stevenson et al. ....... 204/298.22 |

FOREIGN PATENT DOCUMENTS

| JP | 7-251058 A | 10/1995 |
| JP | 8-64542 A | 3/1996 |
| JP | 10-326844 A | 12/1998 |
| JP | 2004-89872 A | 3/2004 |
| JP | 2006-283096 A | 10/2006 |
| JP | 2007-73542 A | 3/2007 |
| WO | WO-2005/069359 A1 | 7/2005 |

OTHER PUBLICATIONS

English Translation, JP 2004-89872 (Yoshinori et al ), Published Mar. 25, 2004.*
English Translation, JP 10-326844 (Makoto), Published Dec. 8, 1998.*

* cited by examiner

Primary Examiner — Laura Edwards
(74) Attorney, Agent, or Firm — Arent Fox LLP

(57) ABSTRACT

The present invention provides a chamber 1 comprising a chamber section 2 having a substrate processing compartment into which a substrate is loaded for a predetermined processing step, and reinforcing members 3 removably mounted on the discrete outer walls of the chamber section. Each of the reinforcing members comprises a plate-like joint member 32 or a rib member 31 which is removably mounted on the corresponding outer wall of the chamber section. The reinforcing member may comprise both the plate-like joint member 32 and rib member 31.

17 Claims, 7 Drawing Sheets

(a)

(b)

CHAMBER AND FILM FORMING APPARATUS

CROSS-REFERENCE TO RELATED APPLICATION

This application is a National State entry of International Application No. PCT/JP2008/072625, Dec. 12, 2008, which claims priority to Japanese Application No. 2007-323783 filed Dec. 14, 2007, the disclosure of the prior applications are incorporated in their entirety by reference.

TECHNICAL FIELD

The present invention relates to a chamber and a film forming apparatus.

BACKGROUND ART

Flat panel displays have been produced by using many vacuum processing apparatus such as sputtering apparatus for forming metal wiring films, each having a vacuum chamber.

To improve the yield in production of flat panel displays, the glass substrate forming display continues to be increased in size. With the jumboization of this glass substrate, the chamber itself in the processing apparatus is being increased in size such that film formation process and the like can be performed over the entire surface of the substrate. For example, if a glass substrate having a size of 2,850 mm×3,050 mm is to be processed, the processing chamber may have its height or width exceeding 5 m. If such an assembled chamber is to be transported to a desired installation site, a large-scaled transportation means such as large-sized trailer is required.

Since such a large-sized chamber formed from flat, it is also required to provide reinforcing members on the discrete outer walls of the chamber to maintain the necessary intensity thereof. Each of the reinforcing members is attached to the corresponding surface of the chamber mainly by welding. However, the whole chamber may be further increased in size by the attachment of the reinforcing members. This raises a problem in that the chamber will not be able to be transported under legal restrictions relating to size and weight.

To overcome such a problem, a chamber having side walls which are formed by welding a plurality of wall components together has been proposed (e.g., refer to a patent document 1). If the discrete wall components are transported to an installation site and then welded together therein, a large-sized chamber can be relatively easily transported to and assembled in the installation site.

Patent Document 1:
Japanese Laid-Open Patent Publication Hei 8-64542 (FIG. 1)

DISCLOSURE OF THE INVENTION

Problem to be Solved by the Invention

According to the invention of the patent document 1, even a large-sized processing apparatus can be transported by dividing one chamber wall into a plurality of wall components. However, this raises another problem in that leakage tends to occur since the inner wall of the chamber forming a vacuum processing chamber are formed by welding a plurality of wall components together. This is generally because the welded portion tends to create a pinhole or pinholes and also because a stress due to atmospheric pressure concentrates at a portion of wall component in which a heat strain is frequently produced by welding when the chamber is evacuated.

To overcome the problem in the prior art, an object of the present invention is therefore to provide a chamber which comprises a chamber section without joining welds and which can be easily transported even if it is a large-sized chamber. Another object of the present invention is to provide a film forming apparatus using such a chamber.

Means for Solving the Problem

The present invention provides a chamber comprising a chamber section into which a substrate is loaded and in which a predetermined substrate processing is performed and removable reinforcing members on the discrete outer walls of the chamber.

The chamber of the present invention can be easily transported by downsizing the overall apparatus since the reinforcing members can be removed on transportation by removably mounting the reinforcing members on the discrete outer walls of the chamber section. Further, the chamber of the present invention can suppress an occurrence of leakage when the chamber section is evacuated. Since the inner wall of the chamber section for processing a substrate, by removably mounting the reinforcing members on the discrete outer walls of the chamber section, does not have a joint.

Each of the reinforcing members is preferably in the form of a plate-like joint member removably mounted on the outer wall or a rib member removably mounted on the outer wall. The plate-like joint member can have any configuration selected for the contour of the chamber section, including flat and curved configurations. It is also preferred that each of the reinforcing members comprises both the rib and joint members, the rib member being removably mounted on the outer wall through the joint member. In this manner, the chamber can be maintained with a predetermined structural strength without increase of the wall thickness of the joint member.

It is further preferred that the reinforcing members is mounted on the discrete outer walls of the chamber section at its surface portions that are exposed to the atmosphere. The surface portion of the outer chamber wall that is exposed to the atmosphere is one that will not be connected to another chamber which comprises a vacuum processing chamber to be evacuated. When a substrate processing compartment is evacuated, the chamber section may be strained at this surface portion of the outer chamber due to the difference between the vacuum and the atmosphere. According to the present invention, the chamber can be prevented from being strained even when the substrate processing compartment is evacuated by the reinforcing members mounted on the discrete surface portion of the outer chamber wall that is exposed to the atmosphere.

It is preferred that the outer chamber wall on which the joint member is mounted is covered over all regions having no functional member for performing a predetermined process within the chamber section. In such a manner, the chamber can provide its structural strength sufficient to suppress distortion even when the chamber section is evacuated.

The chamber of the present invention can be increased in size and is convenient in transportation since the reinforcing members are removably mounted on the chamber section. If the chamber is configured such that a predetermined processing step can be performed to a substrate to be processed which is held by a substrate carrier substantially in the vertical position, the chamber may be used as a so-called vertical processing chamber in which the installation area can be reduced. The term "substantially in the vertical position" used herein includes any position in which the substrate to be processed is perfectly vertically placed or inclined from the vertical position to an angle less than 45 degrees.

It is further preferred that a part of the wall surface of the chamber section includes an opening formed therein, through which a magnet is removably attached to the corresponding reinforcing member. In such a case, the reinforcing member of the present invention can be removed, and also can be attached the magnet, depending on the application or use of the chamber for flexibly dealing with a situation. If another magnet is located on the substrate carrier for holding the substrate, wobbling can be suppressed when the substrate carrier is moved.

It is further preferred that the rib member comprises a plurality of longitudinal and transverse rib components intersecting each other, a crane being fixedly placed in a space formed by the longitudinal and transverse rib components. In such a case, the rib member can be removed, and also can be attached the crane, depending on the application or use of the chamber for flexibly dealing with a situation. The crane can be safely held by the rib member since the rib member firmly supports the crane. More particularly, the crane comprises a base portion fixedly placed within a space formed by the longitudinal and transverse rib components, a supporting portion connected to the base portion, an arm portion connected to the supporting portion for rotation about the axis of the supporting portion, and a mounting portion connected to the tip of the arm portion through a hanging portion and a cable member. In this manner, the crane can be placed simply and easily on the rib member and can be transported together with this rib member.

The present invention further provides a film forming apparatus comprising a plurality of vacuum chambers each having a chamber section in which a predetermined processing step is performed to a substrate, said apparatus being characterized by that each chamber section comprises a reinforcing member removably mounted on the corresponding outer wall of the chamber section. Since the reinforcing members can be removed on transportation in such an arrangement, the entire apparatus to be transported can be reduced in size for easy transportation. It is preferred that the outer wall of the chamber section includes a top wall, a bottom wall and a side wall which is not connected to another chamber.

Effects of the Invention

According to the present invention, the chamber can provide excellent advantages in that it is convenient for transportation and that any occurrence of leakage can be suppressed. Furthermore, the film forming apparatus of the present invention can provide a great advantage in that it is convenient for transportation.

EXPLANATION OF REFERENCE NUMERALS

Figure 1:
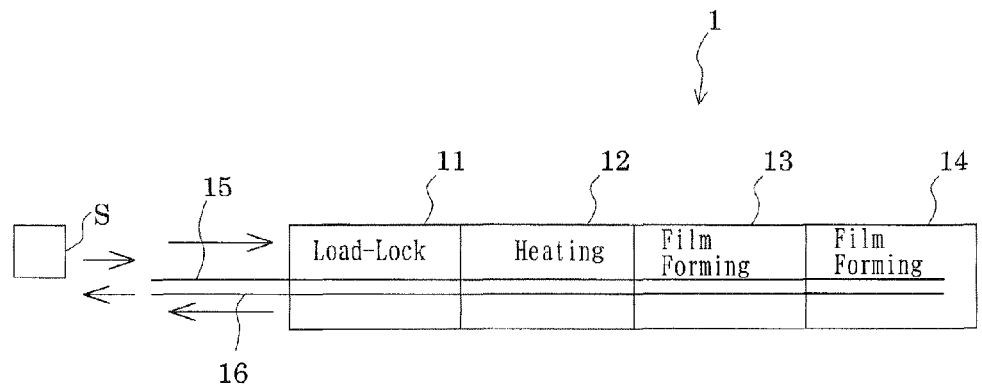
FIG. 1 This is a schematic view illustrating the structure of a processing apparatus.

1 Processing Apparatus
2 Chamber Section
3 Reinforcing Member
4 Substrate Carrier
11 Load-Lock Compartment
12 Heating Compartment
13 First Film Forming Compartment
14 Second Film Forming Compartment
31 Rib Member
32 Joint Member
S Substrate

BEST MODE FOR CARRYING OUT THE INVENTION

Several embodiments of the present invention will not be described with reference to FIGS. 1-5. It is to be noted that the same components are attached by the same reference numerals in the drawings.

FIG. 1 is a schematic view illustrating the structure of a processing apparatus. The processing apparatus 1 is of a vertical type wherein a substrate to be processed is held in the substantially vertical position and comprises a load-lock compartment 11, a heating compartment 12, a first film forming compartment 13 and a second film forming compartment 14, which compartments are connected to one another in line. The processing apparatus 1 also comprises a forwarding path 15 and a returning path 16 which extend from the load lock compartment 11 to the second film forming compartment 14.

Each of these compartments comprises a vacuum pump (not shown) and a processing means for performing a predetermined processing step in that compartment. More particularly, a heating means is located on one inner side of the heating compartment 12, while a film formation means is located on one inner side of each of the first and second film forming compartments 13 and 14. The second film forming compartment 14 comprises a path changing means for moving a substrate carrier 4 (described later) holding a substrate S between the forwarding path 15 and the returning path 16.

The substrate carrier 4 is conveyed on the forwarding and returning paths 15 and 16 while holding the substrate S substantially in the vertical position. The substrate held by this substrate carrier is moved to the respective one of the compartments on the forwarding path 15 by substrate carrier 4, wherein the substrate is processed in a predetermined manner in respective the compartment. In the second film forming compartment 14, thereafter, the substrate is moved from the forwarding path 15 to the returning path 16 by the path changing means and then outside the processing apparatus 1 through the returning path 16. More particularly, the substrate S is first conveyed into the load-lock compartment 11 wherein the substrate S is placed under vacuum. The substrate S is then moved into the heating compartment 12 while being maintained under vacuum and heated to a predetermined temperature. The heated substrate is them moved into the first film forming compartment 13 wherein a predetermined film is formed over the substrate 1. Thereafter, the substrate S is moved into the second film forming compartment 14 wherein the substrate is shifted onto the returning path 16 by the path changing means. Thereafter, the substrate S is moved on the returning path 16 from the second film forming compartment 14 through the first film forming compartment 13, heating compartment 12 and load-lock compartment 11 and finally removed from the processing apparatus 1.

Each of the compartments is in the form of a chamber having a substrate processing compartment. The substrate carried into the processing apparatus 1 may be in the form of a large-sized substrate, for example, having its dimensions of 2,850 mm×3,050 mm. In order to process such a large-sized substrate, a large-sized chamber having a substrate processing compartment of sufficient size that can receive the large-sized substrate is required. Further, in such an in-line-type vertical processing apparatus as described above, a reinforcing member must be mounted on the outside of the chamber section. In this case, if a chamber is formed by integrally mounting the reinforcing member on such a chamber section such as a load-lock compartment 11 having its substrate processing compartment which can receive the large-sized substrate, the chamber becomes too large and probably may not be transported to a desired installation site.

Therefore, this embodiment of the present invention provides a reinforcing member which is removably mounted on the chamber section forming each of the chambers. The reinforcing members can be removed from the chamber on transportation and again mounted on the chamber after it has been installed. The structure of such a chamber will be described with reference to FIGS. 2 and 3 which illustrate the heating compartment 12.

Figure 2:
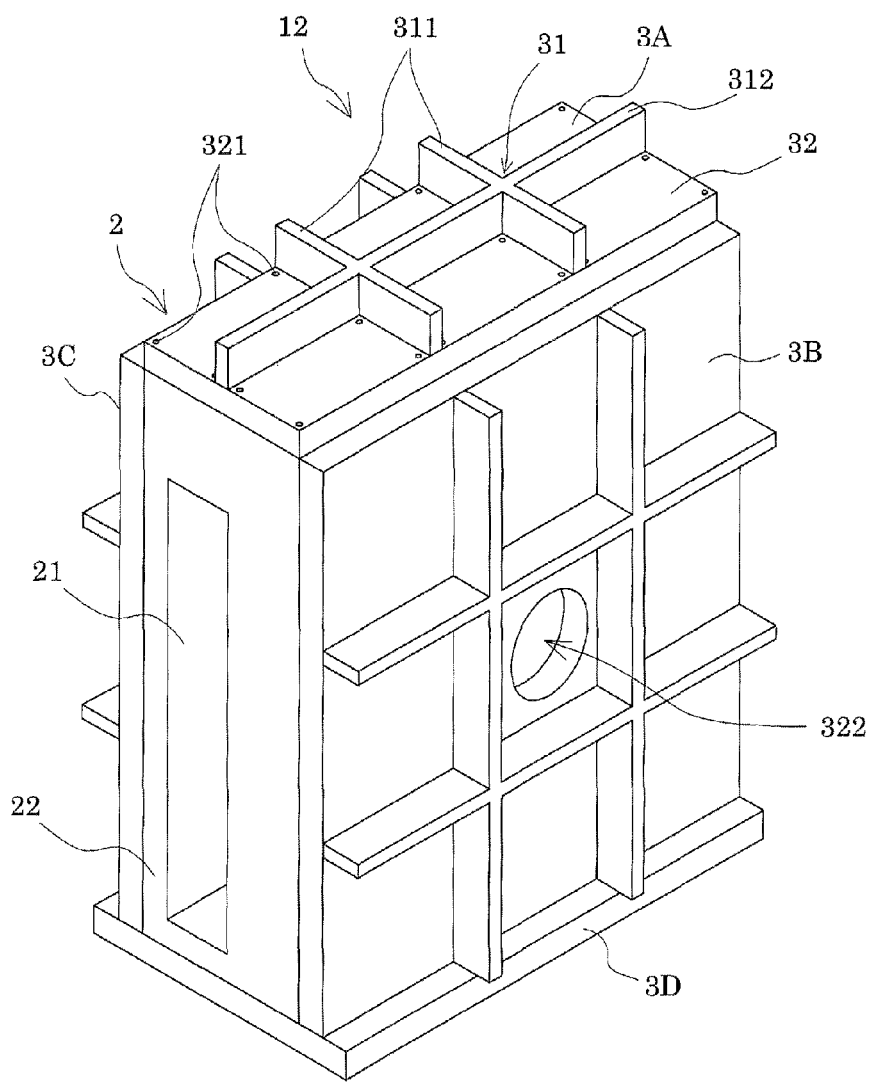
FIG. 2 This is a schematic view illustrating a chamber according to the present invention.
Figure 3:
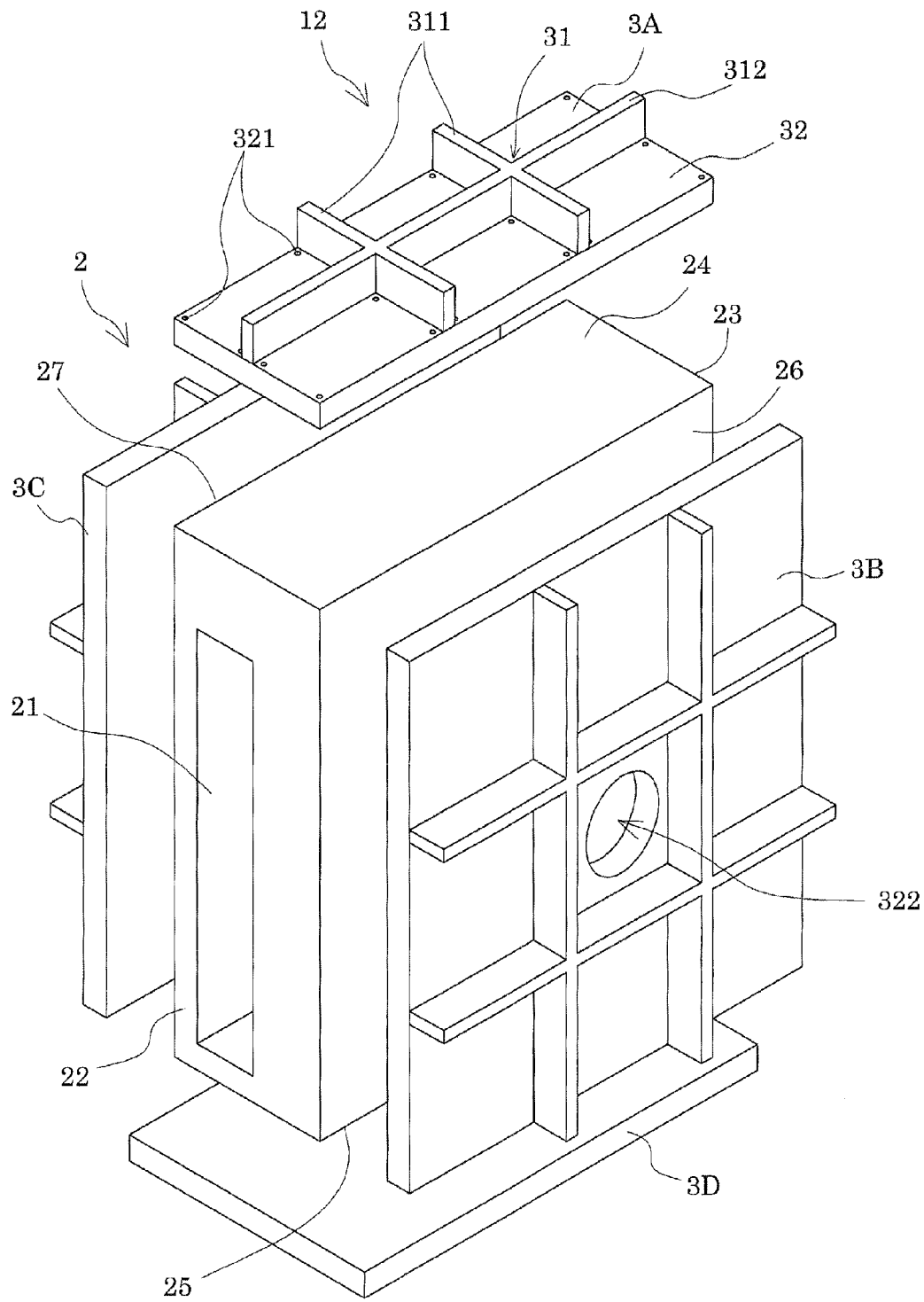
FIG. 3 This is a schematic view illustrating the same chamber according to the present invention.

FIGS. 2 and 3 are schematic views illustrating the structure of the heating compartment 12 using the chamber according to the present invention. The heating compartment 12 has a chamber section 2. The chamber section 2 is in the form of a rectangular parallelepiped as shown in FIG. 3. In order to process a large-sized substrate to be processed which is held substantially in the vertical position, the rectangular parallelepiped has a short depth (as measured along the shorter sides of a substrate inlet 21 which will be described below) and vertical and horizontal sides which are larger than those of the large-sized substrate (e.g., 2,850 mm×3,050 mm). The chamber section 2 includes a rectangular substrate inlet 21 which is formed through one side 22 of the load-lock compartment 11. This substrate inlet 21 is communicated with a deaerating room of the load-lock compartment 11 shown in FIG. 1 and also with a heat treatment room (not shown) in the chamber section. The substrate inlet 21 extends to the opposite side 23 of the first film forming compartment 13. The heat treatment room includes a vacuum pump (not shown) and a heating means (not shown). Thus, the heat treatment room can depressurize its interior to a predetermined pressure. At the same time, the heat treatment room can heat its interior to a predetermined temperature and maintain it at that temperature.

To prevent any distortion in the chamber section when it is evacuated, reinforcing members 3A, 3D, 3B and 3C are respectively mounted on outer walls exposed to the atmosphere, that is, top wall 24, bottom wall 25 and side walls 26 and 27 among the outer walls of the chamber section 2. The sides 22 and 23 of the chamber section adjacent to the load-lock compartment 11 and first film forming compartment 13 include no reinforcing member 3. Each of the reinforcing members 3A, 3B and 3C comprises a rib member 31 and a plate-like joint member 32 to which the rib member 31 is joined. The reinforcing member 3D mounted on the bottom wall 25 of the chamber section 2 only comprises a plate-like joint member 32. In view of the installation site and so on, the reinforcing member 3 may be formed by at least one of the rib member 31 and joint member 32.

The joint member 32 is configured such that it can be removably mounted on one of the mounting surfaces of the chamber section 2 by a mounting member. As an example, the joint member 32 of the reinforcing member 3A is removably mounted on the chamber section 2 through bolts 321, as shown in FIG. 2. In this case, it is preferable that the joint member 32 covers the entire mounting surface of the chamber section 2. If the chamber section 2 of the above-mentioned processing apparatus includes, for example, regions for placing functional parts of each performing a predetermined processing step such as vacuum pump and heating means, however, it is preferred that all regions other than the regions for placing these functional parts are covered with the joint members 32. In the drawings, the joint member 32 of the reinforcing member 3B is shown to cover all the regions of the chamber section except a region 322 for placing a vacuum pump (now shown). In other words, the joint member 32 of the reinforcing member 3B covers the side 26 of the chamber section except an opening formed at a position corresponding to the region 322. In this manner, the chamber section can be given greater strength.

The rib member 31 of each of the reinforcing members 3A, 3B and 3C is fastened to the corresponding joint member 32, for example, by welding. The removably fastening manner of the rib member 31 will be described later. The rib member 31 comprises longitudinal and transverse ribs 311, 312 which are assembled with each other in a lattice manner. For example, the rib member 31 of the reinforcing member 3A comprises one transverse rib 312 and two longitudinal ribs 311 which intersect the transverse rib 312 at right angle. In each of the reinforcing members 3B and 3C, the rib member 31 comprises two longitudinal ribs 311 and two transverse ribs 312, which ribs are assembled to provide a lattice. The rib member 31 may be of any configuration such as stripe or zigzag if the chamber will not be distorted when the chamber is evacuated. Furthermore, the rib member 31 may be mounted on at least one of the outer walls of the chamber section. Even such a structure can suppress a distortion in the outer walls of the chamber. For example, one rib member 31 may be mounted centrally on the top wall of the chamber. In this manner, the rib member may extend on one of the outer walls of the chamber from one end to another to suppress the distortion of the outer walls of the chamber. Further, the rib member 31 may comprise only longitudinal rib(s) 311 or transverse rib(s) 312. Moreover, the rib member 31 may comprise only longitudinal rib(s) 311 or transverse rib(s) 312 which are assembled slantly with one another.

In this manner, the chamber of the present invention can have a desired strength when the heating compartment 12 is evacuated since the reinforcing members 3A-3D are mounted on the outer walls of the chamber. Since the reinforcing members 3A-3D (each of which comprises the joint member 32 and rib member(s) 31) are removably mounted on the chamber, the reinforcing members 3A-3D can be removed from the chamber to reduce in size on transportation. This is convenient for transportation.

Figure 4:
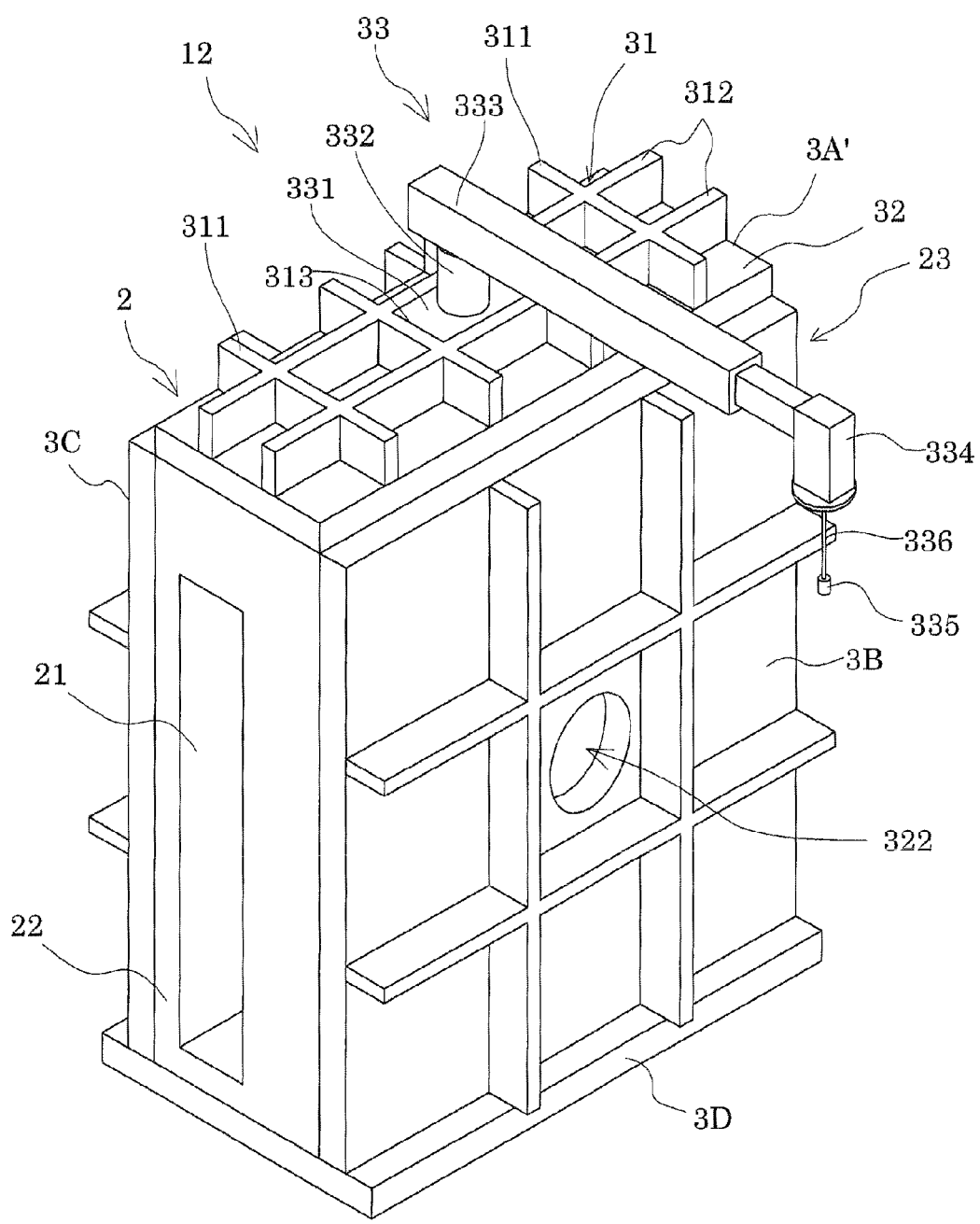
FIG. 4 This is a schematic view illustrating another chamber according to the present invention.

Furthermore, the rib member 31 can be changed with another as necessary, since the reinforcing members 3A-3D are removable. For example, FIG. 4 is a schematic view illustrating another structure of the heating compartment 12. According to this embodiment, a reinforcing member 3A' mounted on the top wall of the chamber section 2 comprises a rib member 31 which is different from that of the reinforcing member 3A shown in FIG. 2. More particularly, this reinforcing member 3A' is different from the reinforcing member 3A in that it comprises four longitudinal ribs 311 and two transverse ribs 312 which are assembled into a lattice.

The longitudinal and transverse ribs 311, 312 form a central compartment 313 in which a crane 33 is mounted. The crane 33 can be used to carry exchangeable members such as anti-joining plate and heater plate which are mounted in the chamber and must be changed, for example, on maintenance. The crane 33 comprises a base portion 331 which is fixedly mounted in the central compartment 313 and a column-shaped support portion 332 connected to the base portion 331. The longitudinal and transverse ribs 311 and 312 are arranged to form the central compartment 313 corresponding to the shape of the base portion 331. The central compartment 313 receives the base portion 331 such that it is firmly supported by the longitudinal and transverse ribs 311, 312 through fasteners (not shown). The column-shaped support portion 332 includes an arm portion 333 which is rotatably connected to the support portion 332 as a center shaft. This arm portion 333 comprises a hanging portion 334 mounted on the tip thereof and a mounting portion 336 mounted on the hanging portion 334 through a cable member 335. The mounting portion 336 is movable in the vertical direction by changing the length of the cable member 335. The crane 33 can hold an exchangeable member in a hung state when the mounting portion 336 is moved in the vertical direction and then connected to the exchangeable member. In this case, the exchangeable member connected to the mounting portion 336 can be freely moved in the leftward and rightward directions since the arm portion 333 is rotatably connected to the support portion 332. In this embodiment, the longitudinal and transverse ribs 311, 312 are arranged for the shape of the base portion 331. Thus, the base portion 331 can be firmly supported by these ribs. As a result, the crane 33 can be held safely. If the reinforcing member 3A' having the above longitudinal ribs 311 is used, since the reinforcing member 3A' has another two longitudinal ribs 311, the strength will be increased. Therefore, the reinforcing member 3A' can be used as a support member for supporting the crane 33 which has its increased weight as described. Since the reinforcing members 3A-3D are removable in such a manner, one or more of the reinforcing members 3A-3D can be changed to another reinforcing member having a different rib arrangement as necessary such that the rib member 31 can be used as a support member for a different exchangeable member. This provides an improved versatility.

Figure 5:
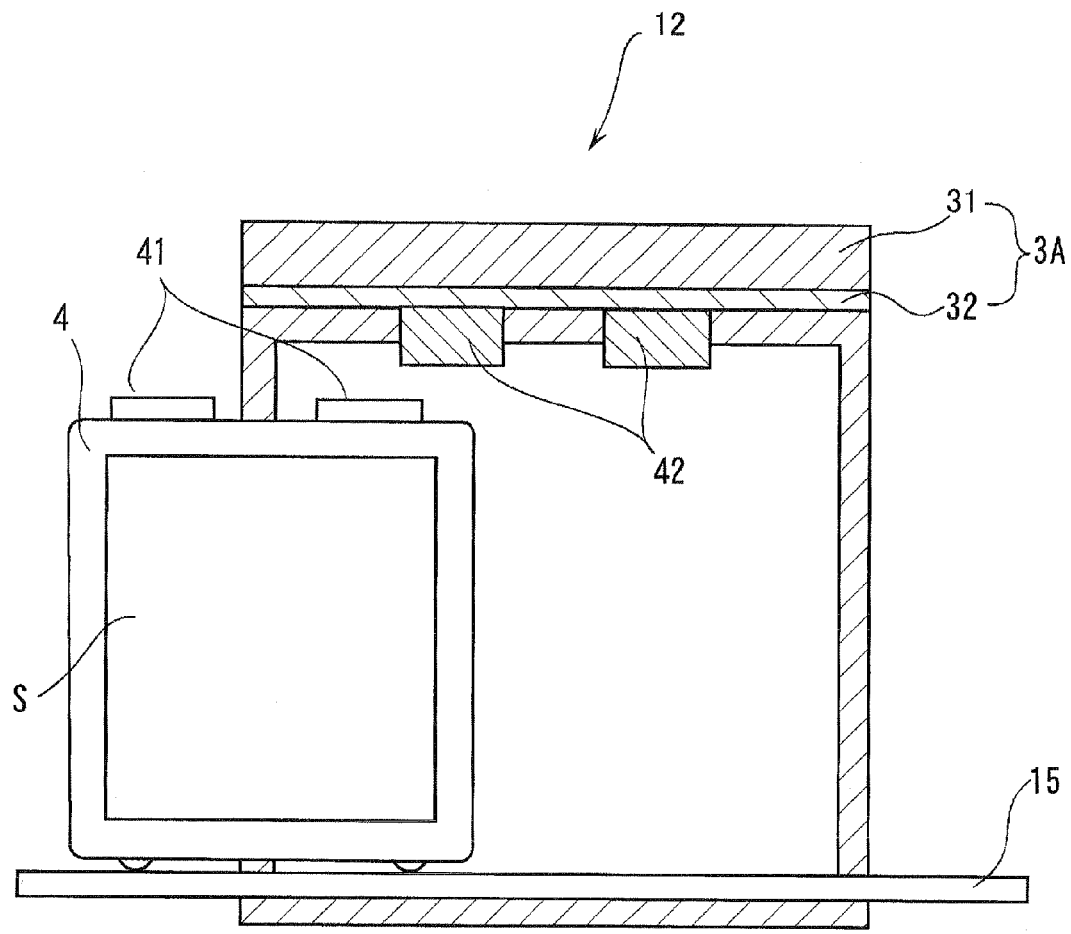
FIG. 5 This is a schematic cross-sectional view of a heating compartment.

Furthermore, since the reinforcing members 3 are removable, an internal structure connected with each of the joint members 32 can be exchanged to another structure for the internal structure of the heat treatment room as necessary. For example, FIG. 5 is a schematically cross-sectional view of the heating compartment for illustrating the structure of the heat treatment room. The interior of the heating compartment 12 comprises a forwarding path 15 in its bottom, the forwarding path 15 being used as a substrate conveyance path. The substrate carrier 4 is movable on the forwarding path 15 in the bottom. The substrate carrier 4 holds a substrate S substantially in the vertical position.

If the substrate is a large-sized substrate exceeding 1 meter, the substrate S may be held substantially in the vertical position by a further holding member in addition to the substrate carrier 4. For such a purpose, the embodiment according to FIG. 5 comprises magnets 41 located on the top of the substrate carrier 4 and further magnets 42 connected to the joint member 32 through openings that are formed through the top wall of the chamber section 2. The magnets 41 and 42 can magnetically hold the substrate carrier 4 in its vertical position on the forwarding and returning paths 15 and 16. Therefore, the substrate S can be transported safely. In this manner, the magnet 42 as one of the holding members is coupled to the joint member 32. For example, if it is desired that particles magnetically deposited on the magnets 42 are cleaned away, the reinforcing member 3A may be replaced by another reinforcing member including another magnets 42 while reconditioning the old magnets 42 during the film forming process. Accordingly, any internal structure coupled to the joint member 32 may be replaced by another without reducing the operating rate as necessary, since the reinforcing members 3 are removably mounted on the chamber. If only the rib member 31 is used without provision of the joint member 32, the magnet 42 may be mounted directly on the rib member 31.

Figure 6:
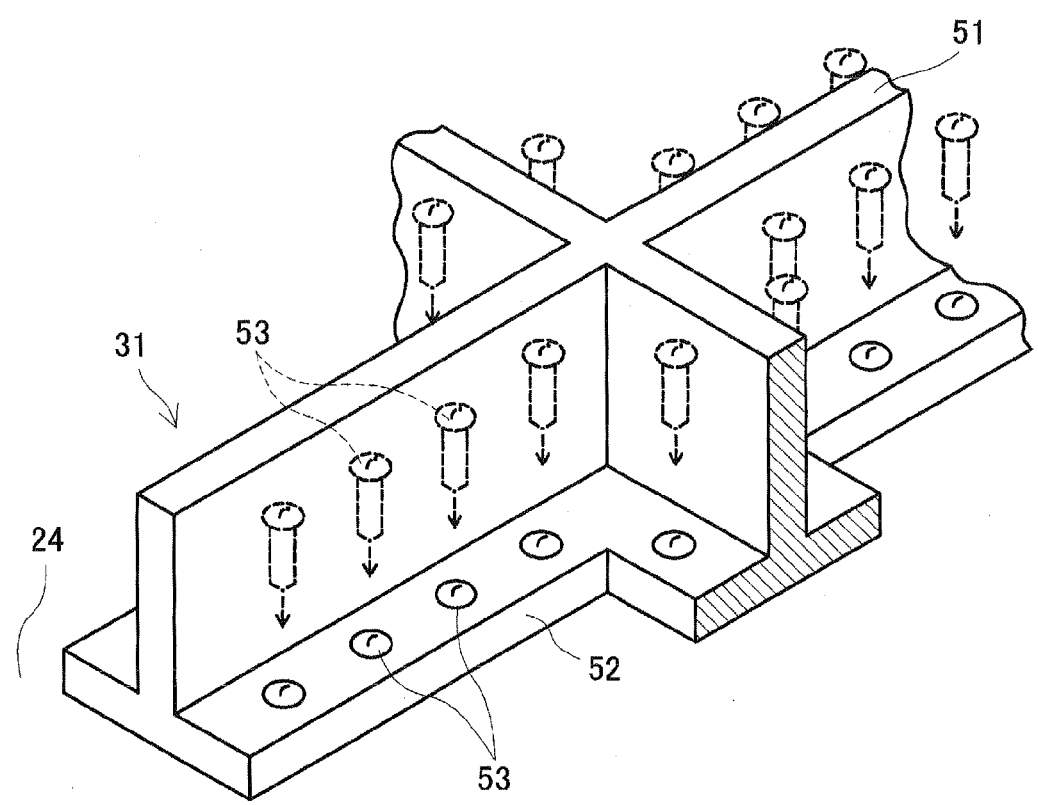
FIG. 6 This is a schematic view to describe a removable rib member.

The removable mount of the rib member 31 will now be described with reference to FIGS. 6-8. FIG. 6 is a perspective view of a rib member 31 mounted on the top 24 of the chamber. As shown in FIG. 6, the rib member 31 comprises rib portions 51 and flange portions 52 formed therein. The flange portions 52 can be removably fastened to the top 24 of the chamber through bolts 53 in a simple manner. This also permits even a large-sized chamber to be transported in a simple and easy manner.

Embodiments shown in FIGS. 7 (a) and (b) will be described. FIGS. 7 (a) and (b) are schematic views illustrating another rib member different from that of FIG. 6: FIG. 7 (a) being a perspective view illustrating rib member and reinforcing member before the rib member is mounted on the reinforcing member; and FIG. 7 (b) being a perspective view illustrating the rib member after it has been mounted on the reinforcing member. In the embodiments of FIGS. 7 (a) and (b), a plurality of pins 54 are located spaced apart from one another on the base of the joint member 32. The flange portion 52 on the rib portion 51 of the rib member 31 is formed with a plurality of pin apertures 523, being gourd shape or tumbling doll shape from the top view, each of which comprises a smaller aperture portion 521 and a larger aperture portion 522 connected to the aperture 512. In this case, the diameter of the smaller aperture portion 521 is of sufficient size to receive the stem 541 of the pin 54 while the diameter of the larger aperture portion 522 is sized to be equal to or larger than the diameter of the head 542 of the pin 54. In order to install this rib member 31 on the joint member 32, the rib member 31 is firstly placed on the joint member 32 to position the heads 542 of the respective pins 54 in the corresponding larger aperture portions 522. Subsequently, the rib member 31 is slidably moved to fit the stems 541 of the respective pins 54 into the corresponding smaller aperture portions 521, thereby fastening the rib member 31 to the joint member 32. In such a manner, the rib member 31 can be removably mounted on the joint member 32 in a simple and easy manner by providing a plurality of pins 54 on the joint member 32 which can be slidably inserted into the pin apertures 523 on the flange portion 52 of the rib member 31. This also permits even a large-sized chamber to be transported in a simple and easy manner.

Next, embodiments of FIGS. 8 (a)-(e) will be described. FIGS. 8 (a)-(e) are schematic views illustrating a further rib member: FIG. 8 (a) being a top plan view of the rib member; FIG. 8 (b) being a cross-sectional view of the rib member taken along a line A-A'; FIG. 8 (c) being a top plan view of a reinforcing member; FIG. 8 (d) being a cross-sectional view of the reinforcing members taken along a line B-B'; and FIG. 8 (e) being a perspective view illustrating the rib member after it has been mounted on the reinforcing member. As shown in FIGS. 8 (a) and (b), the rib portion 51 of the rib member 31 has interrupted flange portions 55. As shown in FIG. 8 (c), the joint member 32 is provided with a groove 56. The groove 56 comprises first groove portions 561 having narrow openings and second groove portions 562 having larger openings and each communicating with the corresponding first groove portion 561. The first and second groove portions 561, 562 are alternately arranged. The opening of each of the second groove portions 562 is equal to or slightly larger than the corresponding flange portion 55 of the rib member 31 and has an invariable width till the bottom thereof. As shown in FIG. 8 (d), the width of each of the first groove portions 561 at the opening thereof is substantially the same as the width of the corresponding rib portion 51 in the rib member 31. The width of each of the second groove portions 562 is the same as the width of the corresponding flange portion.

In order to install the rib member 31 in the groove 56, the rib member 31 is firstly inserted into the groove 56 to fit the flange portions 55 of the rib member 31 into the respective second groove portions 562. Thereafter, the rib member 31 is slidably moved so that each of the flange portions 55 is fixed in the inside of the corresponding first groove portion 561. In this case, the rib member 31 may be more firmly fastened to the joint member 32 by bolts 53 which are passed through bolt holes (not shown) which are formed adjacent to the first groove portions 561. In such a manner, the rib member 31 can be removably fastened to the joint member 31 in a simple and easy manner since the rib member 31 can be slidably inserted into the joint member 32. This also permits even a large-sized chamber to be transported in an easy manner.

Figure 7:
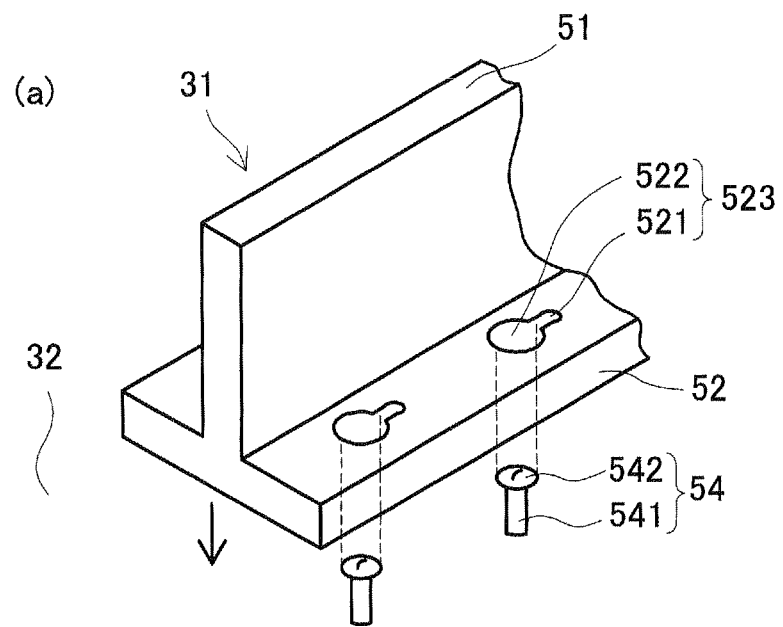
FIGS. 7 (*a*) and (*b*) These are schematic views illustrating another removable rib member.
Figure 7:
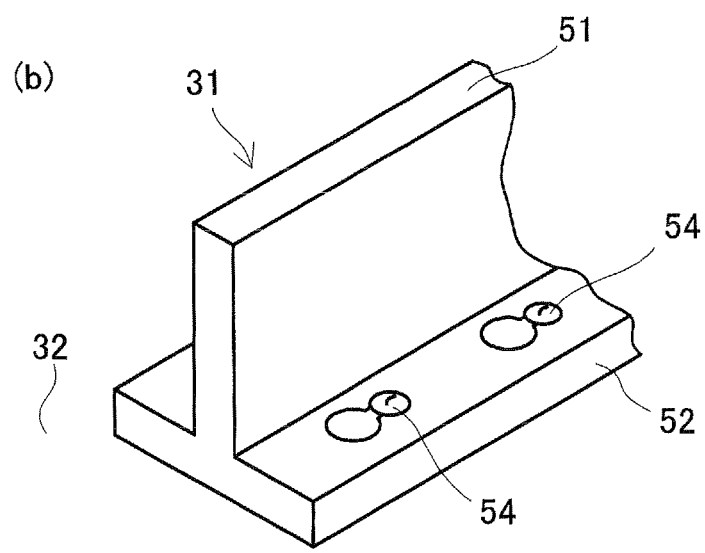
Figure 8:
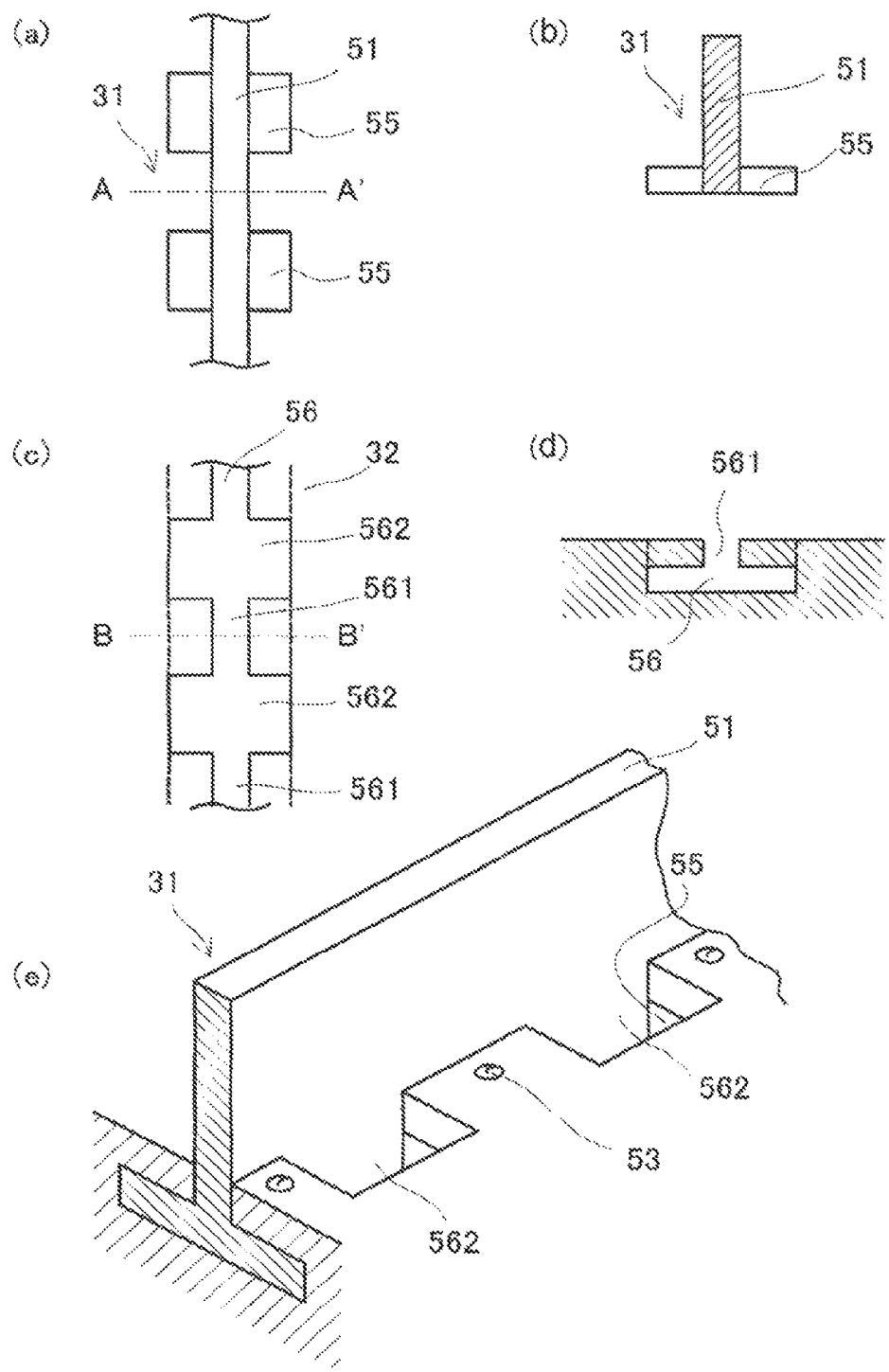
FIGS. 8 (*a*)-(*e*) These are schematic views illustrating a further removable rib member.

Although the embodiments of FIGS. 7 (a)-(b) and FIGS. 8 (a)-(e) have been described as to the rib member 31 mounted on the joint member 32, the present invention is not limited to such arrangements. For example, the rib member may be mounted directly on the outer wall of the chamber section 2. Further, the present invention is not limited to the embodiment of FIG. 6 in which the rib member 31 is mounted on the top 24 of the chamber section 2. It is of course possible that the above-mentioned crane or the like can be mounted on the top of the rib members 31.

Although the heating compartment 12 has been described throughout the embodiments of the present invention, it is to be noted that the same concept can be applied to the other compartments, the load-lock compartment 11, first film forming compartment 13 and second film forming compartment 14. Similarly, the reinforcing members can be modified depending on the internal structure and exterior member. It is further to be noted that the present invention can be similarly applied to a system other than the film forming apparatus for the large-sized substrate. Although the embodiments of the present invention have been described as to the removable reinforcing members 3A-3D, all the reinforcing members may not be removable if there is no problem on transportation. For example, only the reinforcing member 3A may be removable. It is of course possible that only the rib member 31 or joint member 32 in the reinforcing member 3A may be removable.

Although the embodiments of the present invention have been described such that the reinforcing member 3D on the bottom 25 of the chamber section does not have the rib member 31, in another embodiment, the reinforcing member 3D may have the rib member 31. In this case, the chamber section 2 may be mounted on a mounting bed which is supported by the rib members 31.

INDUSTRIAL APPLICABILITY

The chamber according to the present invention can be used to form films over a large-sized substrate. Accordingly, it is available in the field of semiconductor production.

What is claimed is:

1. A vacuum chamber comprising:
a chamber section for receiving a substrate for a predetermined processing step;
a plurality of removable reinforcing members on a plurality of discrete outer walls of the chamber section;
an opening formed in a wall surface of the discrete outer walls on a top of the chamber section; and
a magnet removably mounted on the corresponding reinforcing member through the opening, wherein the magnet is adapted to hold the substrate, and
wherein the chamber is adapted for use under vacuum conditions.

2. The vacuum chamber according to claim 1, wherein at least one of said reinforcing members comprises a rib member removably mounted to a joint corresponding to the discrete outer wall of the chamber section.

3. The vacuum chamber according to claim 2, wherein the joint is in the form of a plate-like member removably mounted on the corresponding outer wall of the chamber section and wherein said rib member is mounted on the corresponding outer wall of the chamber section through the joint member.

4. The vacuum chamber according to claim 2, wherein said rib member comprises a plurality of longitudinal and transverse rib components intersecting one another, and wherein a crane is fixedly placed in a space formed by the longitudinal and transverse rib components.

5. The vacuum chamber according to claim 4, wherein said crane comprises a base portion fixedly placed within the space formed by the longitudinal and transverse rib components, a supporting portion connected to the base portion, an arm portion rotatably mounted on the supporting portion as a center shaft, and a mounting portion mounted on the tip of the arm portion through a hanging portion and a cable member.

6. The vacuum chamber according to claim 1, wherein a plate-like joint member is removably mounted on the corresponding outer wall of the chamber section.

7. The vacuum chamber according to claim 6, wherein each joint covers the entire region of the corresponding outer chamber wall which has no functional member for performing a predetermined process within the chamber section.

8. The vacuum chamber according to claim 1, wherein said reinforcing member is mounted on any one of said outer walls that is exposed to the atmosphere.

9. The vacuum chamber according to claim 1, wherein said chamber section is configured to hold a substrate carrier substantially in the vertical position during the predetermined processing step.

10. A film forming apparatus comprising:
a plurality of vacuum chambers, each of which comprises,
a chamber section for performing a predetermined processing step for a substrate;
a removable reinforcing member mounted on top outer wall of the chamber section, the removable reinforcing member comprising a joint mounted to the top outer wall;
an opening formed in a wall surface of the top outer wall of the chamber section; and
a magnet removably mounted through the opening and coupled to the joint, wherein the magnet is adapted to hold a substrate, and
wherein at least one of the vacuum chambers is adapted to deposit a film on the substrate.

11. The film forming apparatus according to claim 10, wherein the outer walls of the chamber section include a top wall, a bottom wall and a side wall which is not connected to another chamber.

12. A vacuum chamber comprising:
a chamber section adapted to receive a substrate, the chamber section comprising a top wall having a plurality of openings;
a removable joint attached to the top wall;
a plurality of removable ribs attached to the joint; and
a plurality of magnets coupled to the joint through the plurality of openings, wherein the magnets are adapted to hold the substrate, and wherein
the vacuum chamber is adapted to hold the substrate during a predetermined processing step performed under vacuum conditions.

13. The vacuum chamber according to claim 12, wherein the plurality of magnets are adapted to hold the substrate within a substrate carrier.

14. The vacuum chamber according to claim 12, comprising a plurality of rib members removably attached to the joint.

15. The vacuum chamber according to claim 14, wherein the rib members are arranged in a longitudinal and transverse configuration to form a lattice structure, and wherein the rib members form a central compartment in which a crane is attached to the joint.

16. The vacuum chamber according to claim 14, wherein side walls of the chamber section comprise a plurality of rib members removably attached to joints attached to the side members.

17. The vacuum chamber according to claim 12, wherein the joint entirely covers the top wall.

* * * * *